(12) United States Patent
Kugler et al.

(10) Patent No.: US 7,515,359 B2
(45) Date of Patent: Apr. 7, 2009

(54) SUPPORT DEVICE FOR POSITIONING AN OPTICAL ELEMENT

(75) Inventors: Jens Kugler, Heubach (DE); Ulrich Weber, Ulm (DE); Sabine Hafenrichter, Aalen-Waldhausen (DE)

(73) Assignee: Carl Zeiss SMT AG, Oberkochen (DE)

( * ) Notice: Subject to any disclaimer, the term of this patent is extended or adjusted under 35 U.S.C. 154(b) by 110 days.

(21) Appl. No.: 11/578,361

(22) PCT Filed: Apr. 14, 2004

(86) PCT No.: PCT/EP2004/003920

§ 371 (c)(1),
(2), (4) Date: Oct. 13, 2006

(87) PCT Pub. No.: WO2005/101131

PCT Pub. Date: Oct. 27, 2005

(65) Prior Publication Data

US 2007/0216888 A1    Sep. 20, 2007

(51) Int. Cl.
*G02B 7/02* (2006.01)
(52) U.S. Cl. ...................... 359/811; 359/813
(58) Field of Classification Search ............... 359/696, 359/811–814, 819, 823, 824
See application file for complete search history.

(56) References Cited

U.S. PATENT DOCUMENTS

| | | | | |
|---|---|---|---|---|
| 4,726,671 A | * | 2/1988 | Ahmad et al. | 359/848 |
| 4,976,582 A | | 12/1990 | Clavel | 414/729 |
| 5,545,040 A | * | 8/1996 | Lu | 434/58 |
| 6,362,926 B1 | | 3/2002 | Omura et al. | 359/727 |
| 6,402,329 B1 | * | 6/2002 | Bailly et al. | 359/872 |
| 6,859,337 B2 | | 2/2005 | Oshino et al. | 359/819 |
| 6,873,478 B2 | | 3/2005 | Watson | 359/819 |
| 2002/0020069 A1 | | 2/2002 | Bottinelli et al. | 33/1 |
| 2002/0163741 A1 | | 11/2002 | Shibazaki | 359/819 |
| 2004/0189969 A1 | | 9/2004 | Mizuno | 355/67 |

FOREIGN PATENT DOCUMENTS

| | | |
|---|---|---|
| EP | 0503712 | 3/1992 |
| EP | 0964281 | 5/1999 |
| WO | WO03/081337 A2 | 10/2003 |

OTHER PUBLICATIONS

PCT International Search Report dated Dec. 2, 2004 in respect to corresponding PCT Application No. PCT/EP2004/003920.

* cited by examiner

*Primary Examiner*—Mohammed Hasan
(74) *Attorney, Agent, or Firm*—Ohlandt, Greeley, Ruggiero & Perle, L.L.P.

(57) ABSTRACT

Support device for positioning an optical element includes a first frame unit and a plurality of support units. Each of the support units has a first end for fixedly engaging a part of the first frame unit and a second end for supporting the optical element. The support units are arranged for positioning the optical element along first, second and third directions in a manner of parallel kinematic. The first, second and third directions being translatory directions arranged mutually transverse to each other. There are provided three support units, each of which provides for restriction of first and second degrees of freedom to support the optical element in an isostatic manner, and one of the support units comprises a movable part bearing an entire fraciton of a load to be taken by the one of the support units.

21 Claims, 5 Drawing Sheets

SUPPORT DEVICE FOR POSITIONING AN OPTICAL ELEMENT

BACKGROUND OF THE INVENTION

The present invention relates to a support device for positioning an optical element, in particular for positioning a lens. Furthermore, it relates to a lens barrel comprising such a support device and an optical exposure apparatus comprising such a lens barrel. The invention may be used in the context of photolithography processes for fabricating microelectronic devices, in particular semiconductor devices, or in the context of fabricating devices, such as masks or reticles, used during such photolithography processes.

Typically, the optical systems used in the context of fabricating microelectronic devices such as semiconductor devices comprise a plurality of optical elements such as lenses. Those lenses usually cooperate in an exposure process to transfer an image formed on a reticle or the like onto a substrate such as a wafer. Due to the ongoing miniaturization of semiconductor devices there is a permanent need for enhanced resolution of the optical systems used for fabricating those semiconductor devices. This need for enhanced resolution obviously pushes the need for an increased numerical aperture and increased imaging accuracy of the optical system. Furthermore, to reliably obtain high-quality semiconductor devices it is not only necessary to provide an optical system showing a high degree of imaging accuracy. It is also necessary maintain such a high degree of accuracy throughout the entire exposure process. Thus, in certain cases, there is a need for at least some kind of fine adjustment during the operation time of the optical system.

To obtain such a high degree of imaging accuracy it is known, among others, to adjust the position of at least certain ones of the optical elements with respect to other optical elements of the optical system used during the exposure process. This is done in order to compensate, over the entire system, for imaging errors inherent to the single optical elements of the system. To this end, it is known to use support devices supporting the respective optical element which allow for active positioning of the respective optical element in space.

A further problem in this context lies within the increased dimensions and, thus, the increased mass of the optical elements due to the increased numerical aperture of the optical system. On the one hand, the increased mass of the optical elements to be moved during adjustment poses dynamic problems due to the lowered resonant frequencies of the system. Furthermore, the increased mass of the optical elements to be supported leads to increased stresses within the support elements supporting the respective optical element.

Many of the known support devices use so-called serial kinematics wherein parts providing position adjustment in a first direction carry and position the parts providing position adjustment in a different, second direction. This serial arrangement, on the one hand, leads to an accumulation of the positioning errors and, thus, either more or less poor adjustment quality or increased effort to obtain satisfactory positioning accuracy. Furthermore, due to the actuators to be moved, such a serial arrangement implies a considerable mass to be moved and, thus, undesired low resonant frequencies of the support and lens system. Such a support device with serial kinematics is disclosed, for example, in U.S. Pat. No. 6,362,926 to Omura et al.

On the other hand, it known to use so-called parallel kinematics avoiding the problems associated with the above serial kinematics. With such parallel kinematics the parts providing position adjustment are arranged kinematically parallel, i.e. each of them provides for position adjustment without being dislocated in its entirety by the actuations of other parts providing position adjustment. US 2002/0163741 A1 to Shibazaki, for example, discloses a generic support device using parallel kinematics for holding an optical element of an optical exposure apparatus. In one embodiment, this support device comprises six support units arranged in the manner of a hexapod. Those support units allow for translatory positioning of the associated optical element along the coordinate axes of an orthogonal coordinate system (XYZ) as well as rotatory positioning of the associated optical element with respect to those coordinate axes. Such an arrangement allows for the maximum possible adjustability of the position of the optical element with six degrees of freedom. Anyway, it shows the disadvantage of a very complicated design with a large number of movable parts and manipulating mechanisms for moving those movable parts. Furthermore, the large number of manipulating mechanisms leads to an increased effort for controlling the manipulation and, thus, the positioning process.

In the general context of the above parallel kinematics, US 2002/0020069 A1 to Bottinelli et al. discloses a support device for positioning a body in space. In one embodiment this support device comprises three support units supporting said body. Each of said support units is mounted movably to a guide rail on a supporting structure for positioning the body by translating the respective support unit along its guide rail. Due to the kinematically serial arrangement of the drive mechanism within the kinematic chain of the positioning structure such a guide rail solution is not desirable for supporting an optical element to be used in the context of the above micro-lithography processes. This is due to the fact that such a solution is prone to not provide the necessary accuracy over the time due to effects of wear or setting. Otherwise, such a solution would require undesired additional effort for avoiding the above disadvantageous effects.

Furthermore, also in the general context of the above parallel kinematics, U.S. Pat. No. 4,976,582 to Clavel discloses a support device for positioning a movable element, such as a tool, in space using rod kinematics as support units. In one embodiment each of said support units is mounted movably to a longitudinal guide mechanism on a supporting structure for positioning the body by translating the respective support. This solution is similar to the above solution disclosed by Bottinelli et al. (US 2002/0020069 A1) and suffers form the same disadvantages. In another embodiment each of said support units is mounted movably to a rotational guide mechanism on a supporting structure for positioning the body by rotating parts of the respective support unit. Such a rotational guide solution, as well, is not desirable for supporting an optical element to be used in the context of the above micro-lithography processes. This is due to the fact that, again due to the kinematically serial arrangement of the drive mechanism within the kinematic chain of the positioning structure, such a solution is also prone to not providing the necessary accuracy over the time due to effects of wear or setting. Otherwise, such a solution as well would require undesired additional effort for avoiding the above disadvantageous effects. Furthermore, the rod kinematics themselves comprise several such rotational guides. Thus, for the reason outlined above, they are not desirable for supporting an optical element to be used in the context of the above microlithography processes.

SUMMARY OF THE INVENTION

It is thus an object of the present invention to provide for positioning of an optical element, in particular a lens, in space in three translatory directions arranged mutually transverse to each other that, at least to some extent, overcomes the above disadvantages.

It is a further object of the present invention to provide for positioning of an optical element, in particular a lens, in space in three translatory directions arranged mutually transverse to each other allowing for a high degree of imaging accuracy with a corresponding optical system.

It is a further object of the present invention to provide for positioning of an optical element, in particular a lens, in space in three translatory directions arranged mutually transverse to each other at a reduced design, construction and control effort.

It is a further object of the present invention to provide for positioning of an optical element, in particular a lens, in space in three translatory directions arranged mutually transverse to each other at high accuracy and with good repeatability over time.

The above objects are achieved by a support device showing the features of claim 1. They are also achieved by a lens barrel showing the features of claim 20. Furthermore, they are achieved by an optical exposure apparatus showing the features of claim 21.

According to a first aspect of the present invention there is provided a support device for positioning an optical element, in particular a lens, comprising a first frame unit and a plurality of support units for supporting said optical element. Each of said support units has a first end for fixedly engaging a part of said first frame and a second end for supporting said optical element. Said support units are arranged for positioning said optical element along a first direction, a second direction and a third direction in the manner of parallel kinematics. Said first direction, said second direction and said third direction are translatory directions arranged mutually transverse to each other. Furthermore, there are provided three support units, wherein each of said support units provides for restriction of a first degree of freedom and a second degree of freedom to support said optical element in an isostatic manner.

It has been found that, with such a support device, it is possible to achieve positioning of said optical element at a high accuracy and with good repeatability over time using a considerably reduced number of support units. This leads to reduced design and construction effort and to reduced control effort for manipulating the support units and, thus, for positioning the optical element. It has been found that the fixed engagement between the first support unit and a part of the first frame unit allows for a kinematically parallel arrangement of the drive mechanism within the kinematic chain of the positioning structure. This, in turn, allows for positioning of said optical element at a high accuracy and with good repeatability over time using a considerably reduced number of support units According to a second aspect of the present invention there is provided a lens barrel, in particular for an optical exposure apparatus, comprising at least one lens module, said lens module comprising an optical element and a support device for positioning an optical element according to the present invention, said support device supporting said optical element.

According to a third aspect of the present invention there is provided an optical exposure apparatus for transferring an image of a pattern formed on a mask onto a substrate comprising an optical projection system with a lens barrel according to the present invention.

Further embodiments of the present invention will become apparent from the dependent claims and the following description of preferred embodiments which refers to the appended figures.

DETAILED DESCRIPTION OF THE INVENTION

In the following, a first preferred embodiment of a support device according to the present invention and a preferred embodiment of an optical exposure apparatus according to the present invention comprising a preferred embodiment of a lens barrel according to the present invention will be described with reference to FIGS. 1 to 3.

Figure 1:
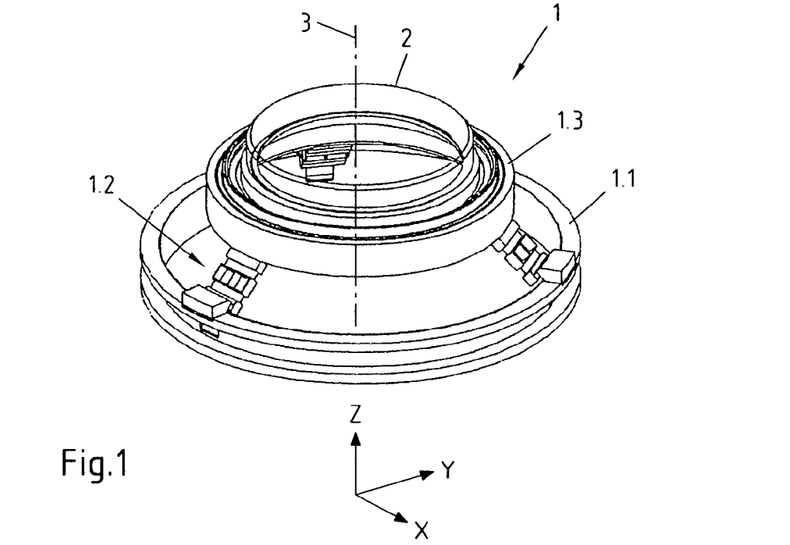
FIG. 1 is a schematic perspective view of a preferred embodiment of a support device according to the present invention.

FIG. 1 is a schematic perspective view of a support device 1 for positioning an optical element in the form of a lens 2. Anyway, it will be appreciated that, with other embodiments of the present invention, any other type of optical elements may be positioned. The support device 1 comprises a first frame unit 1.1 and three identical support units 1.2 distributed equiangularly at the circumference of the first frame unit 1.1 for supporting a second frame unit 1.3 carrying the lens 2.

As will be explained in detail further below, the support units 1.2 together are arranged for positioning the lens 2 along a translatory first direction X, a translatory second direction Y and a translatory third direction Z in the manner of parallel kinematics. The directions X, Y, Z are mutually transverse to each other and form a global orthogonal coordinate system (XYZ). The third direction Z is collinear to an optical axis 3 of a lens barrel which will be described in detail further below.

Figure 2:
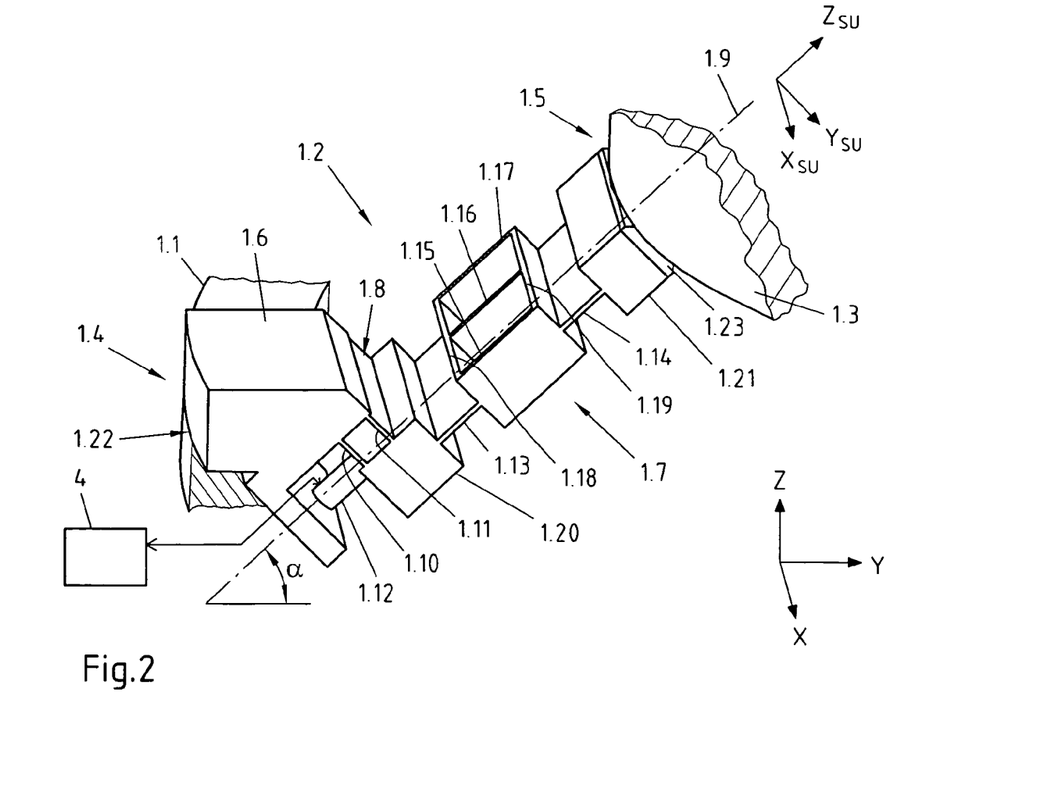
FIG. 2 is an enlarged schematic partial sectional view of the support device of FIG. 1.

As can be taken in detail from FIG. 2, each of said support units 1.2 has a first end 1.4 for fixedly engaging a part of the first frame unit 1.1 and a second end 1.5 for supporting the optical element 2 via the second frame unit 1.3. The second end 1.5 is fixedly connected to the second frame unit 1.3. Anyway, it will be appreciated that, with other embodiments of the present invention, the second end of the respective support unit may directly contact the respective optical element to be supported without interposition of any second frame unit or the like.

Each support unit 1.2 comprises a base part 1.6 and a movable part 1.7 connected to the base part 1.6 via a guiding part 1.8. The base part 1.6 is fixedly connected to the first frame unit 1.1 and forms the first end 1.4. The movable part 1.7 has a first longitudinal extension along its longitudinal axis 1.9 and comprises the second end 1.5 of the support unit 1.2. Anyway, it will be appreciated that, with other embodiments of the present invention, the base part may be omitted and the guiding part may be directly connected to a part of the first frame unit. In this case, the guiding part forms the first end of the support unit.

The guiding part 1.8 connects the base part 1.6 and the movable part 1.7 in a monolithic manner. To this end, the guiding part 1.8 comprises two elongated first leaf spring elements 1.10 and 1.11 each incorporating a first elastic hinge element. The first leaf spring elements 1.10 and 1.11 extend between the base part 1.6 and the movable part 1.7 to form a first parallelogram guide mechanism for guiding the movable part 1.7 along its longitudinal extension in parallel to its longitudinal axis 1.9.

To actively position the lens 2 each support unit 1.2 comprises a positioning device 1.12 kinematically arranged in parallel to the guiding part 1.8 between the base part 1.6 and the movable part 1.7. While the positioning device 1.12 determines the distance between the base part 1.6 and the movable part 1.7 along the longitudinal axis 1.9 of the movable part 1.7, the guiding part 1.8 guides the movable part. Setting effects or the like within the positioning device 1.2 do not affect the achievable guiding result of the movable part 1.7 and thus the achievable positioning result of the lens 2. This is on the one hand due to the kinematically parallel arrangement of the guiding part 1.8 and the positioning device 1.12 and on the other hand due to the monolithic connection provided by the guiding part 1.8. In other words, any desired position of the movable part 1.7 along its longitudinal extension may be reached at a very high repeatability without being affected by such adverse effects.

In the present embodiment, the positioning device 1.12 is an active device in the form of a piezoelectric actuator. The actuator 1.12 modifies the distance between the base part 1.6 and the movable part 1.7 along the longitudinal axis 1.9 of the movable part 1.7. Consequently, the actuator 1.12 provides for a fine adjustment of the position of the movable part 1.7 and, thus, of the lens 2 with respect to the first frame unit 1.1. The actuator 1.12 is connected to an associated control unit 4 for controlling the operation of the actuator 1.12.

The positioning device 1.12 may also comprise a kinematically serial combination of a piezoelectric actuator and a second actuator providing for a wider range of motion than the piezoelectric actuator. The second actuator may then provide for a coarse adjustment of the position of the lens 2 with respect to the first frame unit 1.1, while the piezoelectric actuator provides for the fine adjustment of the position of the lens 2.

Anyway, it will be appreciated that, with other embodiments of the present invention, the positioning device may comprise any other device providing for adjustment of the distance between the base part and the movable part along the longitudinal axis of the movable part. For example, the positioning device may comprise another active device working according to another working principle, e.g. another electric, hydraulic, electro-hydraulic principle etc. Furthermore, passive devices may be used, such as differential screws, spacers etc. Finally it will be appreciated that any combination of the devices mentioned above may be used.

The positioning devices 1.12 of the support units 1.2 together serve to position the lens in the first direction X, the second direction Y and the third direction Z. The positioning of the lens 2 in all three translatory directions in space is due to the fact that the longitudinal axis 1.9 and, thus, the first longitudinal extension of the respective movable part 1.7 is inclined with respect to a first plane (XY) defined by the first direction X and the second direction Y as well as inclined with respect to the third direction Z.

A pure translation of the lens 2 in x-direction (or in y-direction or in z-direction) is a combination of translations of the lens 2 along the three longitudinal axes 1.9, which correspond to the moving directions of the movable parts 1.7.

Figure 6:
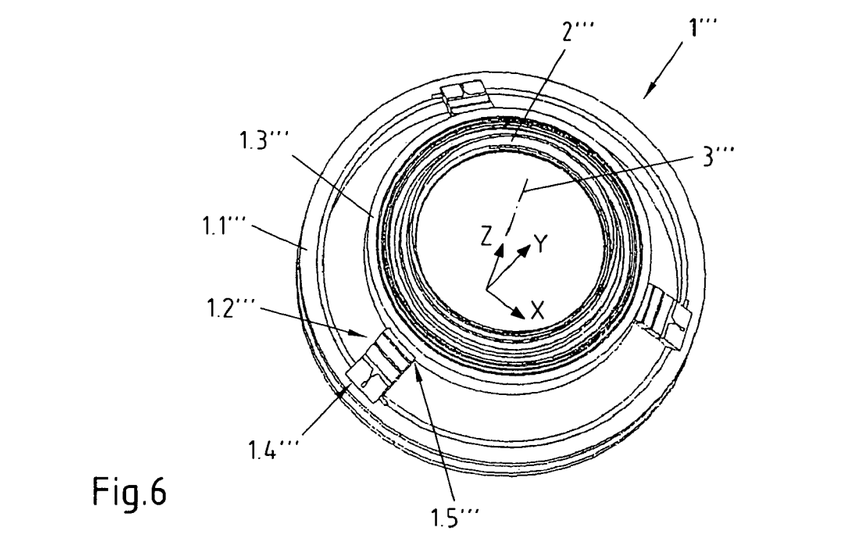
FIG. 6 is a schematic perspective view of a further preferred embodiment of a support device according to the present invention.

The arrangement of the support units 1.2 shown in FIG. 1 (and FIG. 6) has the advantage, that the three longitudinal axes 1.9 of the support units 1.2 are arranged rotation-symmetrically around the lens 2 and form a rectangular axis system. The longitudinal axes 1.9 intersect the z-axis in one point and each longitudinal axis forms an angle $$\alpha = \arctan\left(\sqrt{\frac{1}{2}}\right)$$

with respect to the xy-plane.

For optimizing the ratio of motion transmission from the positioning devices 1.12 to the lens 2 the angle α between the longitudinal axis 1.9 of the movable part 1.7 to the xy-plane may be modified; but the longitudinal axes 1.9 preferably always form a system of linear independent axes for avoiding "instable static arrangements" of the support units 1.2 supporting the second frame unit 1.3 and the lens 2.

By modifying the angle of inclination α between the first plane (XY) and the longitudinal axis 1.9 of the movable part the ratio of motion transmission from the positioning devices 1.12 to the lens 2 in the respective direction may be modified. An angle of inclination a close to 0° results in a motion transmission resulting mainly in a motion of the lens parallel to the first plane (XY), i.e. in the first direction X and the second direction Y. On the other hand, an angle of inclination α close to 90° results in a motion transmission resulting mainly in a motion of the lens 2 in the third direction Z.

The support units 1.2 together support the lens 2 in an isostatic manner. To this end, each of said support units 1.2, at its second end 1.5, provides for restriction of a translatory first degree of freedom and a rotatory second degree of freedom while it provides for two non-restricted translatory degrees of freedom and two non-restricted rotatory degrees of freedom.

In a local orthogonal coordinate system $(X_{SU}, Y_{SU}, Z_{SU})$ of the support unit 1.2, the support unit 1.2 provides for a restriction of the translatory first degree of freedom along the coordinate axis $Z_{SU}$ which is collinear to the longitudinal axis 1.9 of the movable part 1.7. It also provides for a restriction of the rotatory second degree of freedom about the coordinate axis $Y_{SU}$.

The non-restricted degrees of freedom are provided by the movable part 1.7 as will be explained in the following.

The non-restricted translatory degree of freedom along the coordinate axis $Y_{SU}$ is provided by two non-restricted elastic hinge elements in the form of second leaf spring elements 1.13 and 1.14. These plate-like second leaf spring elements 1.13 and 1.14 are arranged in parallel to the longitudinal axis 1.9 of the movable part 1.7. They are also arranged in parallel to the tangential direction of the first frame unit 1.1 at the intersection of the longitudinal axis 1.9 with the first frame unit 1.1. Each of these second leaf spring elements 1.13 and 1.14 also provides for the non-restricted rotatory degree of freedom about the coordinate axis $X_{SU}$ by bending and the non-restricted rotatory degree of freedom about the coordinate axis $Z_{SU}$ by torsion.

The non-restricted translatory degree of freedom along the coordinate axis $X_{SU}$ is provided by three non-restricted elastic hinge elements in the form of third leaf spring elements 1.15, 1.16 and 1.17. Anyway, it will be appreciated that, with other embodiments of the present invention, at least two or more such elastic hinge elements may be provided for providing the non-restricted translatory degree of freedom along the coordinate axis $X_{SU}$.

These plate-like third leaf spring elements 1.15, 1.16 and 1.17 are arranged in parallel to the longitudinal axis 1.9 of the movable part 1.7 and perpendicular to the second leaf spring elements 1.13 and 1.14. The third leaf spring elements 1.15, 1.16 and 1.17 are monolithically connected to the second leaf spring elements 1.13 and 1.14 by connection parts 1.18 and 1.19, respectively.

The different second leaf spring elements 1.13 and 1.14 and third leaf spring elements 1.15, 1.16 and 1.17 provide for a deformation uncoupling. In general, the plate-like leaf spring elements show the advantage that strains are distributed over a considerable distance. Thus, stress peaks and stress gradients are reduced leading to high loads that may be taken by the structure. Furthermore, the plate-like leaf spring elements show the advantage that they provide for a relatively large cross section for load bearing in comparison to "pin-like" flexures (as shown in e.g. US 2002/0163741 A1 to Shibazaki), so that the stress level may be reduced further. On the one hand, this allows for higher dynamic loads to be applied to the structure and, thus, for shorter adjustment cycles. On the other hand, at given dynamic load levels, this allows for smaller load bearing sections leading to less moved mass and increased resonant frequencies.

The second leaf spring element 1.13 is monolithically connected to a lower connection block 1.20 which in turn is monolithically connected to the first leaf spring elements 1.10 and 1.11 of the guiding part 1.8. The second leaf spring element 1.14 is monolithically connected to an upper connection block 1.21 which is connected to the second frame unit 1.3.

In the present embodiment, the connection between the base part 1.6 and the first frame unit 1.1 is provided by a combination of a screw connection (not shown) and a positive connection, i.e. a form fit, with the base part 1.6 sitting in a corresponding recess 1.22 of the first frame unit 1.1. The connection between the movable part 1.7 and the second frame unit 1.3 is provided by a clamping connection (not shown). A coarse adjustment of the position of the lens 2 with respect to the first frame unit 1.1 may be achieved by spacers 1.23 of corresponding thickness inserted and clamped between the movable part 1.7 and the second frame unit 1.3.

Anyway, it will be appreciated that, with other embodiments of the present invention, another type of connection may be selected for either one of the connection between the base part and the first frame unit and the connection between the movable part and the second frame unit. Any suitable connection technology or combinations of different such connection technologies may be chosen. These connection technologies include, for example, positive connections (form fit), non-positive connections (force fit), and material based connections, such as adhesive bonding etc., for example. In particular, also a monolithic connection may be chosen for either one of these connections.

The monolithic design of the base part 1.6, the movable part 1.7 and the guiding part 1.8 using elastic hinges provides for good and reliable positioning results with a very good repeatability. This is due to the fact that setting effects inherent to the contact locations of non-monolithic connections, e.g. detachable connections, are avoided. Thus, preferably, a monolithic connection is selected for at least one of the connections between the base part and the first frame unit and between the movable part and the second frame unit. Anyway, it will be appreciated that, with other embodiments of the present invention, a non-monolithic design may be chosen for all or certain parts, in particular for certain hinges and connections, within the support unit. In general, it is preferred to provide a design for the entire support device which is as monolithic as possible.

Figure 3:
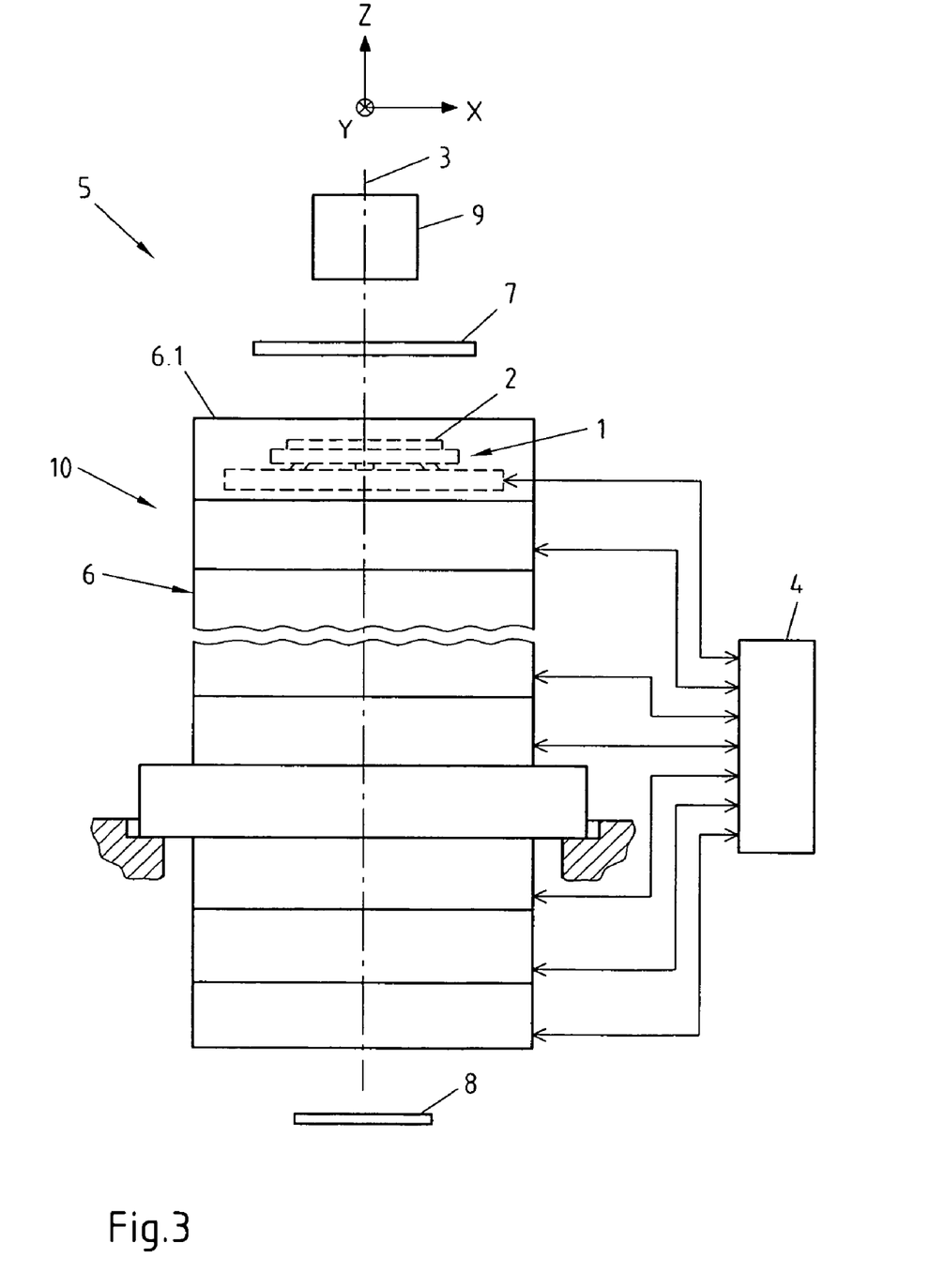
FIG. 3 is a schematic representation of a preferred embodiment of an optical exposure apparatus according to the present invention comprising a preferred embodiment of a lens barrel according to the present invention comprising the support device of FIG. 1.

FIG. 3 shows a schematic representation of a preferred embodiment of an optical exposure apparatus 5 according to the present invention. The optical exposure apparatus 5 comprises a preferred embodiment of a lens barrel 6 according to the present invention.

The optical exposure apparatus 5 is adapted to transfer an image of a pattern formed on a mask 7 onto a substrate 8. To this end, the optical exposure apparatus 5 comprises an illumination system 9 illuminating said mask and an optical projection system 10 comprising the lens barrel 6. The lens barrel 6 projects the image of the pattern formed on the mask 7 onto the substrate 8, e.g. a wafer or the like.

The lens barrel 6 comprises a stack of lens modules 6.1 connected to each other. Each of said lens modules 6.1 comprises a lens 2 and a support device 1 as previously shown in and described with reference to FIGS. 1 and 2. The positioning device 1.12 (not shown in FIG. 3) of the support device 1 of the respective lens module 6.1 is connected to the control unit 4. The control unit 4 continuously controls the operation of these positioning devices to obtain a maximum imaging quality provided by the lens barrel 6. To this end, the control unit 4 may receive information representative of the actual imaging quality provided by the lens barrel 6 and control the operation of the positioning devices of the respective lens module 6.1 in response to this information.

The design according to the present invention providing positioning of the lens 2 in all three translatory directions in space allows—at a minimum number of parts—for almost all adjustments necessary to be provided by such a support device 1 used for adjusting the optical properties of the lenses 2 of the lens barrel 6. This is due to the fact that de-centering of the lens 2 in the X and Y direction with respect to the optical axis 3, in principle, is optically equivalent to tilting the lens about the X and Y direction, respectively. This reduced number of parts, in addition, leads to a lightweight design with the desired high resonant frequencies. These high resonant frequencies, in turn, are advantageous in view of the dynamic adjustment properties of the respective support device 1.

It will be appreciated that, with certain embodiments of the present invention, a rotation of the optical element about the Z axis may be achieved by a simple corresponding rotatory mechanism, if necessary. Such a rotatory mechanism may either be implemented between the optical element and the second frame unit or between parts of the second frame unit or between those parts of the first frame unit the support units are connected to and adjacent parts of the first frame unit etc.

Figure 4:
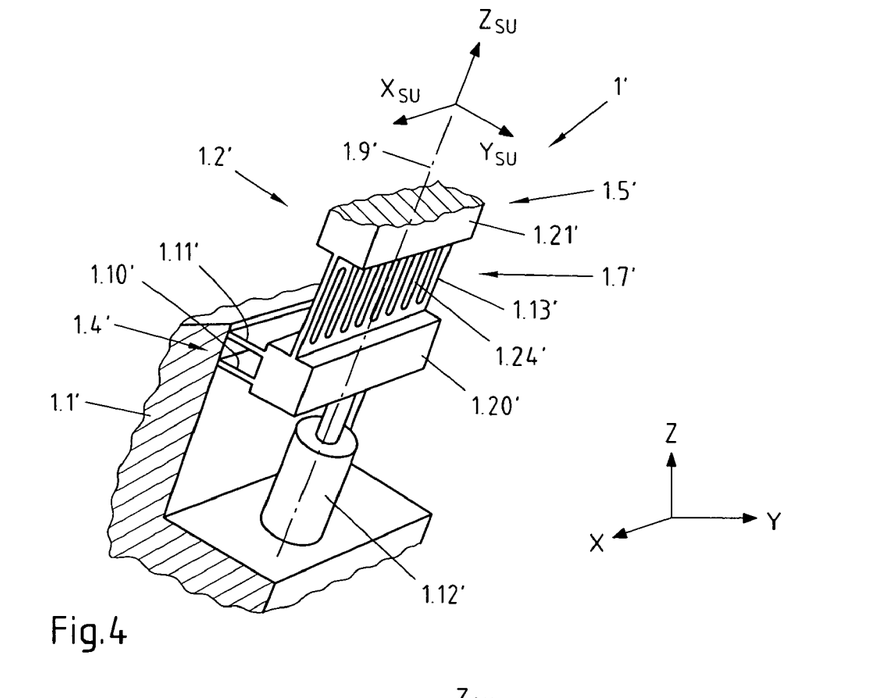
FIG. 4 is a schematic partial sectional view of a further preferred embodiment of a support device according to the present invention.

FIG. 4 is a schematic partial sectional view of a further preferred embodiment of a support device 1' according to the present invention. The support device 1' comprises a circular first frame unit 1.1' and three identical support units 1.2' distributed equiangularly at the circumference of the first frame unit 1.1' for supporting a second frame unit carrying a lens (not shown). The support device 1' in its principal function and its principal design corresponds to the support device 1 shown in FIGS. 1 and 2. Thus, in the following, it will mainly be referred to the differences with respect to the support device 1 shown in FIGS. 1 and 2.

The main difference lies within the design of the respective support unit 1.2'. Other than the embodiment of FIGS. 1 and 2, each support unit 1.2' comprises a movable part 1.7' directly connected to the first frame unit 1.1' via a guiding part 1.8'. The guiding part 1.8' is monolithically connected to the first frame unit 1.1' and forms the first end 1.4' of the support units 1.2'. The movable part 1.7' has a first longitudinal extension along its longitudinal axis 1.9' and comprises the second end 1.5' of the support unit 1.2'.

The guiding part 1.8' connects the first frame unit 1.1' and the movable part 1.7' in a monolithic manner. To this end, the guiding part 1.8' comprises two elongated first leaf spring elements 1.10' and 1.11' each incorporating a first elastic hinge element. The first leaf spring elements 1.10' and 1.11' form a first parallelogram guide mechanism for guiding the movable part 1.7' along its longitudinal extension in parallel to its longitudinal axis 1.9'.

To actively position the lens each support unit 1.2' comprises a positioning device 1.12' kinematically arranged in parallel to the guiding part 1.8' between the first frame unit 1.1' and the movable part 1.7'. In the present embodiment, the positioning device 1.12' is an active device in the form of an actuator 1.12' modifying the distance between the first frame unit 1.1' and the movable part 1.7' along the longitudinal axis 1.9' of the movable part 1.7'.

The positioning devices 1.12' of the support units 1.2' together serve to position the lens in the first direction X, the second direction Y and the third direction Z of an orthogonal coordinate system (XYZ). The positioning of the lens in all three translatory directions in space is due to the fact that the longitudinal axis 1.9' and thus the first longitudinal extension of the respective movable part 1.7' is inclined with respect to a first plane (XY) defined by the first direction X and the second direction Y as well as inclined with respect to the third direaction Z.

The support units 1.2' together support the lens in an isostatic manner. To this end, each of said support units 1.2', at its second end 1.5', provides for restriction of a translatory first degree of freedom and a rotatory second degree of freedom while it provides for two non-restricted translatory degrees of freedom and two non-restricted rotatory degrees of freedom.

In a local orthogonal coordinate system $(X_{SU} Y_{SU} Z_{SU})$ of the support unit 1.2', the support unit 1.2' provides for a restriction of the translatory first degree of freedom along the coordinate axis $Z_{SU}$ which is collinear to the longitudinal axis 1.9' of the movable part 1.7'. It also provides for a restriction of the rotatory second degree of freedom about the coordinate axis $Y_{SU}$.

The non-restricted degrees of freedom are provided by the movable part 1.7' as will be explained in the following. All non-restricted degrees of freedom (i.e. translation along and rotation about the coordinate axis $X_{SU}$, translation along the coordinate axis $Y_{SU}$ and rotation about the coordinate axis $Z_{SU}$) are provided by a non-restricted elastic hinge element in the form of a second leaf spring element 1.13'. To provide the translatory degree of freedom along the coordinate axis $X_{SU}$ it has a slotted design with a plurality of parallel elongated slots 1.24. These slots 1.24 extended in parallel to the longitudinal axis 1.9'. The plate-like second leaf spring element 1.13' is arranged in parallel to the longitudinal axis 1.9'. It is also arranged in parallel to the tangential direction of the first frame unit 1.1' at the intersection of the longitudinal axis 1.9' with the first frame unit 1.1'.

The second leaf spring element 1.13' is monolithically connected to a lower connection block 1.20' which in turn is monolithically connected to the first leaf spring elements 1.10' and 1.11' of the guiding part 1.8'. Furthermore, it is monolithically connected to an upper connection block 1.21' which is connected to the second frame unit.

This embodiment has the advantage of a very simple design which may be easily manufactured. It comprises a very low number of parts and, thus, has a low mass resulting in high resonant frequencies. It will be appreciated that the lens barrel of the optical exposure apparatus shown in FIG. 3 may be equipped with lens modules comprising support devices 1'. In principle, the only difference with respect to the embodiment shown in FIG. 3 then consists of the fact that the support units 1.2 have been replaced by the support units 1.2'.

Figure 5:
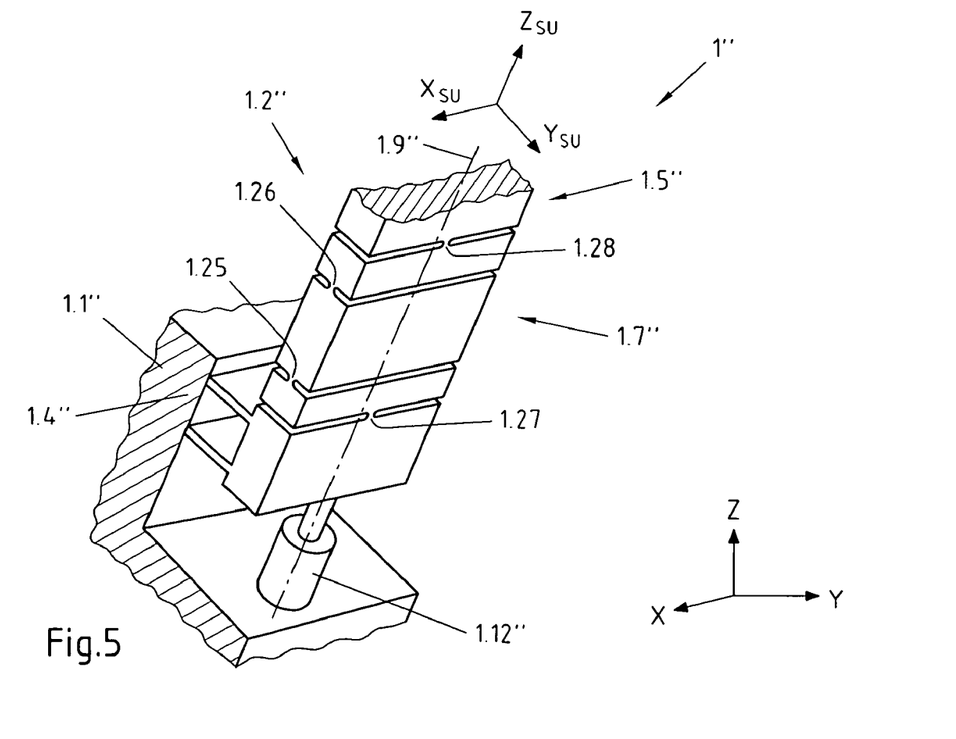
FIG. 5 is a schematic partial sectional view of a further preferred embodiment of a support device according to the present invention.

FIG. 5 is a schematic partial sectional view of a further preferred embodiment of a support device 1" according to the present invention. The support device 1" comprises a circular first frame unit 1.1" and three identical support units 1.2" distributed equiangularly at the circumference of the first frame unit 1.1" for supporting a second frame unit carrying a lens (not shown). The support device 1", in its principal function and its principal design, widely corresponds to the support device 1' shown in FIG. 4. Thus, in the following, it will mainly be referred to the differences with respect to the support device 1' shown in FIG. 4.

The main difference lies within the design of the respective movable part 1.7". Anyway, similar to the embodiment of FIG. 4, each support unit 1.2" comprises a movable part 1.7" directly and monolithically connected to the first frame unit 1.1" via a guiding part 1.8". The guiding part 1.8" forms the first end 1.4" of the support units 1.2". It also forms a first parallelogram guide mechanism for guiding the movable part 1.7' along its longitudinal extension in parallel to its longitudinal axis 1.9". The movable part 1.7" has a first longitudinal extension along its longitudinal axis 1.9" and comprises the second end 1.5" of the support unit 1.2".

To actively position the lens each support unit 1.2" comprises a positioning device 1.12" kinematically arranged in parallel to the guiding part 1.8" between the first frame unit 1.1" and the movable part 1.7". In the present embodiment, the positioning device 1.12 is an active device in the form of an actuator 1.12" modifying the distance between the first frame unit 1.1" and the movable part 1.7" along the longitudinal axis 1.9" of the movable part 1.7'.

The positioning devices 1.12" of the support units 1.2" together serve to position the lens in the first direction X, the second direction Y and the third direction Z of an orthogonal coordinate system (XYZ). The positioning of the lens in all three translatory directions in space is due to the fact that the longitudinal axis 1.9" and thus the first longitudinal extension of the respective movable part 1.7" is inclined with respect to a first plane (XY) defined by the first direction X and the second direction Y as well as inclined with respect to the third direaction Z.

The support units 1.2" together support the lens in an isostatic manner. To this end, each of said support units 1.2", at its second end 1.5", provides for restriction of a translatory first degree of freedom and a rotatory second degree of freedom while it provides for two non-restricted translatory degrees of freedom and two non-restricted rotatory degrees of freedom.

In a local orthogonal coordinate system $(X_{SU}Y_{SU}Z_{SU})$ of the support unit 1.2", the support unit 1.2" provides for a restriction of the translatory first degree of freedom along the coordinate axis $Z_{SU}$ which is collinear to the longitudinal axis 1.9" of the movable part 1.7". It also provides for a restriction of the rotatory second degree of freedom about the coordinate axis $Z_{SU}$.

The non-restricted degrees of freedom are provided by the movable part 1.7" as will be explained in the following. Other than with the embodiment of FIG. 4 the non-restricted degrees of freedom (i.e. translation along and rotation about the coordinate axis $X_{SU}$, translation along and rotation about the coordinate axis $Y_{SU}$) are provided by web-like non-restricted elastic hinge elements 1.25 to 1.28. These elastic hinge elements 1.25 to 1.28 are established by elongated slots within a block forming the movable part 1.7".

The non-restricted translatory degree of freedom along the coordinate axis $Y_{SU}$ is provided by the two non-restricted elastic hinge elements 1.25 and 1.26. These web-like hinge elements 1.25 and 1.26 are arranged in parallel to the coordinate axis $X_{SU}$. Each of these elastic hinge elements 1.25 and 1.26 also provides for the non-restricted rotatory degree of freedom about the coordinate axis $X_{SU}$.

The non-restricted translatory degree of freedom along the coordinate axis $X_{SU}$ is provided by the two elastic hinge elements 1.27 and 1.28. These web-like hinge elements 1.27 and 1.28 are arranged in parallel to the coordinate axis $Y_{SU}$. Each of these elastic hinge elements 1.27 and 1.28 also provides for the non-restricted rotatory degree of freedom about the coordinate axis $Y_{SU}$.

The elastic hinge elements 1.25 to 1.28 provide for a deformation uncoupling. Contrary to ball-bearing-like elastic hinges they show the advantage that strains are distributed over a wider area. Thus, stress peaks and stress gradients are reduced leading to high loads that may be taken by the structure. Furthermore, the web-like hinge elements show the advantage that they provide for a relatively large load bearing section further reducing the stress level. On the one hand, this allows for higher dynamic loads to be applied to the structure and, thus, for shorter adjustment cycles. On the other hand, at given dynamic load levels, this allows for smaller load bearing sections leading to less moved mass and increased resonant frequencies.

This embodiment has the advantage of a very simple design which may be easily manufactured. It comprises a very low number of parts and, thus, has a low mass resulting in high resonant frequencies. To further reduce the total moving mass the dimension of the block forming the movable part 1.7" may be small in the $Y_{SU}$ direction. This is due to the fact that the movable part 1.7" is to be translated or rotated in the $Y_{SU}$ direction anyway. Thus, there is no need for a high flexural rigidity about the $X_{SU}$ axis.

It will be appreciated that the lens barrel of the optical exposure apparatus shown in FIG. 3 may be equipped with lens modules comprising support devices 1". In principle, the only difference with respect to the embodiment shown in FIG. 3 then consists of the fact that the support units 1.2 have been replaced by the support units 1.2".

Figure 7:
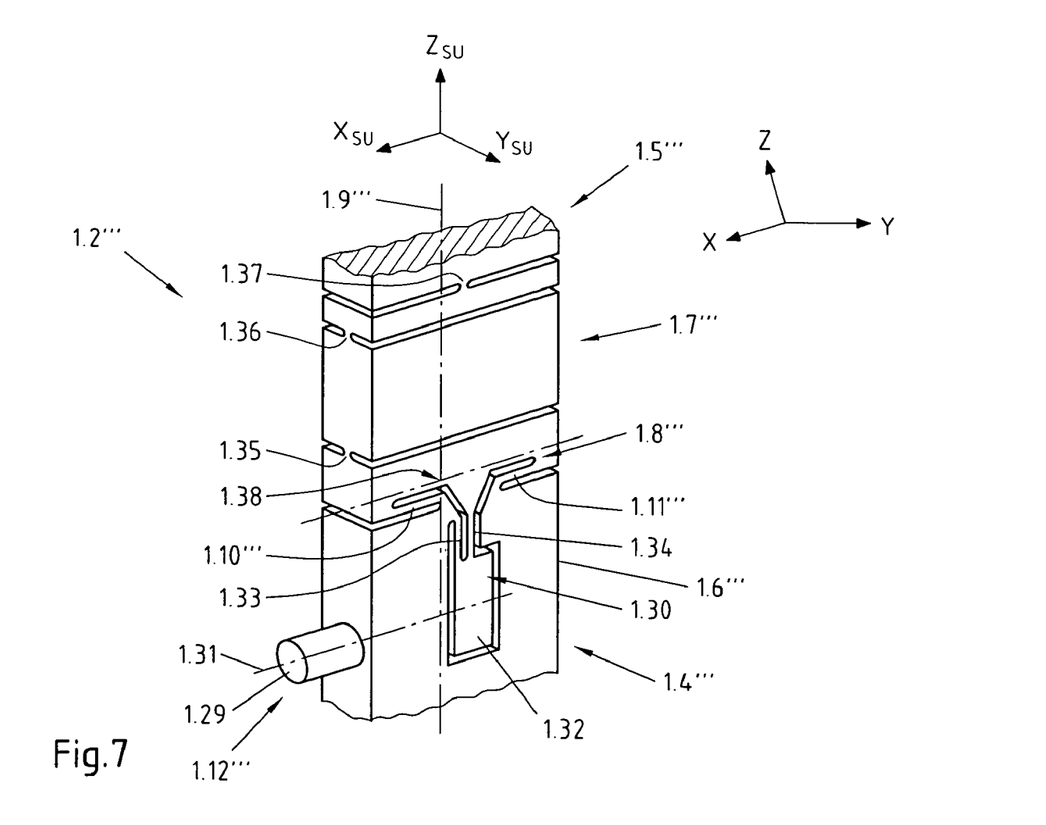
FIG. 7 is an enlarged schematic partial sectional view of the support device of FIG. 6.

FIGS. 6 and 7 relate to a further preferred embodiment of a support device 1''' according to the present invention. The support device 1''' comprises a circular first frame unit 1.1''' and three identical support units 1.2''' distributed equiangularly at the circumference of the first frame unit 1.1''' for supporting a second frame unit 1.3''' carrying a lens 2'''. Again, the support device 1''', in its principal function and its principal design, widely corresponds to the support device 1 shown in FIGS. 1 and 2. Thus, in the following, it will mainly be referred to the differences with respect to the support device 1 shown in FIGS. 1 and 2.

The main difference lies within the design of the respective support unit 1.2'''. Anyway, similar to the embodiment of FIG. 2, each of said support units 1.2''' has a first end 1.4''' for monolithically engaging a part of the first frame unit 1.1''' and a second end 1.5''' for supporting the optical element 2''' via the second frame unit 1.3'''. The second end 1.5''' is connected to the second frame unit 1.3'''. Anyway, it will be appreciated that, with other embodiments of the present invention, the second end of the respective support unit may directly contact the respective optical element to be supported without interposition of any second frame unit or the like.

The support units 1.2''' together are arranged for positioning the lens 2''' along a translatory first direction X, a translatory second direction Y and a translatory third direction Z in the manner of parallel kinematics. The directions X, Y, Z form a global orthogonal coordinate system (XYZ). The third direction Z is collinear to an optical axis 3''' of a lens barrel corresponding to the lens barrel of FIG. 3.

Each support unit 1.2''' comprises a base part 1.6''' and a movable part 1.7''' connected to the base part 1.6''' via a guiding part 1.8'''. The base part 1.6''' is monolithically connected to the first frame unit 1.1''' and forms the first end 1.4'''. The movable part 1.7''' has a first longitudinal extension along its longitudinal axis 1.9''' and comprises the second end 1.5''' of the support unit 1.2'''.

The guiding part 1.8''' connects the base part 1.6''' and the movable part 1.7''' in a monolithic manner. To this end, the guiding part 1.8''' comprises two elongated first leaf spring elements 1.10''' and 1.11''' each incorporating a first elastic hinge element. The first leaf spring elements 1.10''' and 1.11''' extend between the base part 1.6''' and the movable part 1.7''' to form a first guide mechanism for guiding the movable part 1.7 along its longitudinal extension in parallel to its longitudinal axis 1.9'''.

To actively position the lens 2''' each support unit 1.2''' comprises a positioning device 1.12''' kinematically arranged in parallel to the guiding part 1.8''' between the base part 1.6''' and the movable part 1.7'''. While the positioning device 1.12''' determines the distance between the base part 1.6''' and the movable part 1.7''' along the longitudinal axis 1.9''' of the movable part 1.7''', the guiding part 1.8''' guides the movable part. As explained above, due to the kinematically parallel arrangement and the monolithic connection, setting effects or the like within the positioning device 1.2''' do not affect the achievable guiding result of the movable part 1.7''' and thus the achievable positioning result of the lens 2'''.

In the present embodiment, the positioning device 1.12''' is a passive device comprising a differential screw 1.29 acting on a drive mechanism 1.30 along its longitudinal screw axis 1.31. This screw axis is arranged transverse, in particular perpendicular, to the longitudinal axis 1.9''' of the movable part 1.7'''. The drive mechanism 1.30 comprises a drive block 1.32 monolithically hinged to the base part 1.6''' via an elastic hinge leaf spring 1.33. Furthermore, the drive block 1.32 is monolithically connected to the movable part 1.7''' via an elastic drive leaf spring 1.34. When the differential screw 1.29 shifts the drive block 1.30 along its longitudinal screw axis 1.31, the drive leaf spring 1.34 moves the movable part 1.7''' along its longitudinal extension in parallel to its longitudinal axis 1.9'''.

The positioning device 1.12''' modifies the distance between the base part 1.6''' and the movable part 1.7''' along the longitudinal axis 1.9''' of the movable part 1.7'''. Consequently, the differential screw 1.29 provides for a fine adjustment of the position of the movable part 1.7''' and, thus, of the lens 2''' with respect to the first frame unit 1.1'''.

It will be appreciated that, with other embodiments of the present invention, the positioning device may comprise an active device, such as an actuator, instead of the differential screw. This active device may act and be controlled as it has been described above in the context of the embodiment of FIGS. 1 and 2.

The positioning devices 1.12''' of the support units 1.2''' together serve to position the lens 2''' in the first direction X, the second direction Y and the third direction Z. The positioning of the lens 2''' in all three translatory directions in space is due to the fact that the longitudinal axis 1.9''' and thus the first longitudinal extension of the respective movable part 1.7''' is inclined with respect to a first plane (XY) defined by the first direction X and the second direction Y as well as inclined with respect to the third direction Z. By modifying the angle of inclination between the first plane (XY) and the longitudinal axis 1.9 of the movable part the ratio of motion transmission from the positioning devices 1.12" to the lens 2''' in the respective direction may be modified as it has been described above in the context of the embodiment of FIGS. 1 and 2.

The support units 1.2''' together support the lens 2''' in an isostatic manner. To this end, each of said support units 1.2''', at its second end 1.5''', provides for restriction of a translatory first degree of freedom and a rotatory second degree of freedom while it provides for two non-restricted translatory degrees of freedom and two non-restricted rotatory degrees of freedom.

In a local orthogonal coordinate system (XsuYsuZsu) of the support unit 1.2, the support unit 1.2''' provides for a restriction of the translatory first degree of freedom along the coordinate axis $Z_{SU}$ which is collinear to the longitudinal axis 1.9''' of the movable part 1.7'''. It also provides for a restriction of the rotatory second degree of freedom about the coordinate axis $Z_{SU}$.

The non-restricted degrees of freedom are provided by the movable part 1.7''' as will be explained in the following. The non-restricted translatory degree of freedom along the coordinate axis $Y_{SU}$ is provided by the two web-like non-restricted elastic hinge elements 1.35 and 1.36. These elastic hinge elements 1.35 and 1.36 are established by elongated slots within the block forming the movable part 1.7'''. These web-like hinge elements 1.35 and 1.36 are arranged in parallel to the coordinate axis $X_{SU}$. Each of these elastic hinge elements 1.35 and 1.36 also provides for the non-restricted rotatory degree of freedom about the coordinate axis $X_{SU}$.

The non-restricted rotatory degree of freedom about the coordinate axis $Y_{SU}$ is provided by the elastic hinge element 1.37. This web-like elastic hinge element 1.37 as well is established by elongated slots within the block forming the movable part 1.7'''. It is arranged in parallel to the coordinate axis $Y_{SU}$. Furthermore, the non-restricted rotatory degree of freedom about the coordinate axis $Y_{SU}$ is also provided by the guiding part 1.8'''. This is due to the fact that the longitudinal axis of the first leaf spring element 1.10''' and the longitudinal axis of the first leaf spring element 1.11''' intersect with the longitudinal axis of the drive leaf spring 1.34 in one intersection point 1.38. This also provides for good rotational rigidity about the $Z_{SU}$ axis. Furthermore, the non-restricted translatory degree of freedom along the coordinate axis $X_{SU}$ is provided by the web-like non-restricted elastic hinge element 1.37 and the guiding part 1.8'''.

The present embodiment has the advantage that the guiding part 1.8''' integrates the function of guiding relative motion between the base part 1.6''' and the movable part 1.7''' and the function of providing a degree of freedom. This reduces the number of functional parts and, thus, the total mass of the structure which is to be moved leading to desirably high resonant frequencies of the structure. It leads to a very compact and rigid structure.

A further advantage of the present embodiment lies within the fact that, due to the restriction of the rotatory degree of freedom about the respective local coordinate axis $Z_{SU}$, a good tilt compensation of manufacturing tolerances is provided during assembly of the structure.

A further advantage of the present embodiment lies within the fact that the restricted rotatory degree of freedom about the respective local coordinate axis $Z_{SU}$ is collinear to longitudinal axis on the drive leaf spring 1.34. Thus, the drive leaf spring 1.34 may be used for both, moving the movable part 1.7''' and uncoupling.

A further advantage of the present embodiment lies within the fact that the monolithic design of the base part 1.6''', the movable part 1.7''' and the guiding part 1.8''' using elastic hinges provides for good and reliable positioning results with a very good repeatability as it has been explained in detail in the context of the embodiment of FIGS. 1 and 2.

It will be appreciated that the lens barrel of the optical exposure apparatus shown in FIG. 3 may be equipped with lens modules comprising support devices 1'''. In principle, the only difference with respect to the embodiment shown in FIG. 3 then consists of the fact that the support units 1.2 have been replaced by the support units 1.2'''.

Anyway, it will be appreciated that, with other embodiments of the present invention, the lens barrel of the optical exposure apparatus shown in FIG. 3 may be equipped with different lens modules comprising different types of support devices according to the present invention. Furthermore, it may be provided that different support devices provide for different motion transmission between the positioning device and the respective optical element. The selection of the motion transmission may be done according to the needs associated with the respective optical element in view of the optical performance of the lens barrel.

Figure 8:
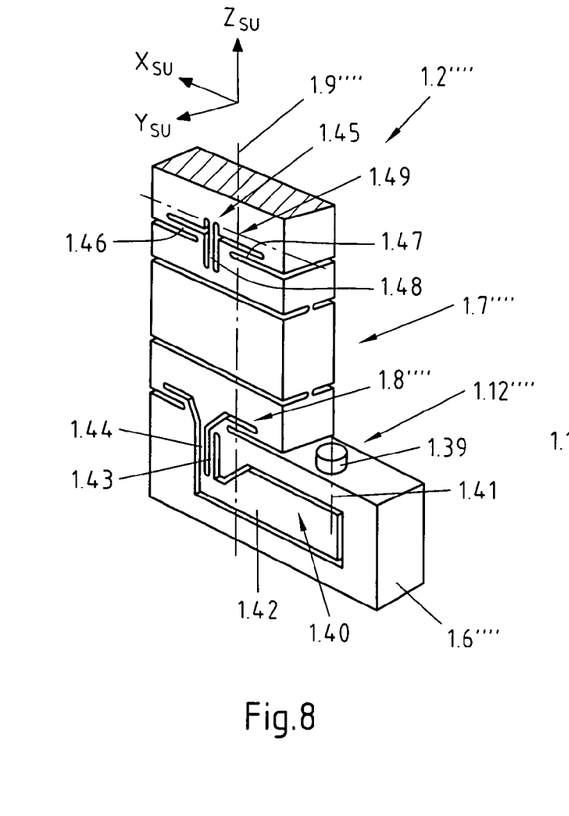
FIG. 8 is a schematic partial sectional view of a further preferred embodiment of a support device according to the present invention.

FIG. 8 is a schematic partial sectional view of a further preferred embodiment of a support unit 1.2'''' for a support device according to the present invention. The support unit 1.2'''', in its principal function and its principal design, widely corresponds to the support units 1.2''' shown in FIG. 7. Thus, in the following, it will mainly be referred to the differences with respect to the support unit 1.2''' shown in FIG. 7.

Similar to the embodiment of FIG. 7, the support unit 1.2'''' comprises a movable part 1.7'''' directly and monolithically connected to a base part 1.6'''' via a guiding part 1.8''''. The guiding part 1.8'''' corresponds to the guiding part 1.8''' of FIG. 7.

One difference with respect to the support unit 1.2''' shown in FIG. 7 lies within the design of the positioning device 1.12''''. In the present embodiment, the positioning device 1.12'''' is a passive device comprising a differential screw 1.39 acting on a drive mechanism 1.40 along its longitudinal screw axis 1.41. This screw axis 1.41 is arranged in parallel to the longitudinal axis 1.9''' of the movable part 1.7''''.

The drive mechanism 1.40 comprises a drive block 1.42 monolithically hinged to the base part 1.6'''' via an elastic hinge leaf spring 1.43. Furthermore, the drive block 1.42 is monolithically connected to the movable part 1.7'''' via an elastic drive leaf spring 1.44. When the differential screw 1.39 shifts the drive block 1.40 along its longitudinal screw axis 1.31, the drive leaf spring 1.44 moves the movable part 1.7'''' along its longitudinal extension in parallel to its longitudinal axis 1.9''''.

A further difference with respect to the support unit 1.2''' shown in FIG. 7 lies within the design of the elastic hinge 1.45 replacing the elastic hinge element 1.37 of the embodiment of FIG. 7 in order to provide the non-restricted rotatory degree of freedom about the coordinate axis $Y_{SU}$. This elastic hinge 1.45 is established by a design similar to the one of the guiding part 1.8''''.

The elastic hinge 1.45 is formed by three elongated leaf springs 1.46, 1.47 and 1.48 established by elongated slots within the body forming the movable part 1.7''''. This is due to the fact that the longitudinal axis of the leaf spring 1.46 and the longitudinal axis of the leaf spring 1.47 intersect with the longitudinal axis of the leaf spring 1.48 in one intersection point 1.49. The longitudinal axes of the leaf springs 1.46 and 1.47 are arranged in parallel to the local coordinate axis $X_{SU}$ while the longitudinal axis of the leaf spring 1.48 is arranged in parallel to the local coordinate axis $Z_{SU}$.

This is due to the fact that the longitudinal axis of the first leaf spring element 1.10''' and the longitudinal axis of the first leaf spring element 1.11''' intersect with the longitudinal axis of the drive leaf spring 1.34 in one intersection point 1.38. This also provides for good rotational rigidity about the $Z_{SU}$ axis. Furthermore, the non-restricted translatory degree of freedom along the coordinate axis $X_{SU}$ is provided by the web-like non-restricted elastic hinge element 1.37 and the guiding part 1.8'''.

Figure 9:
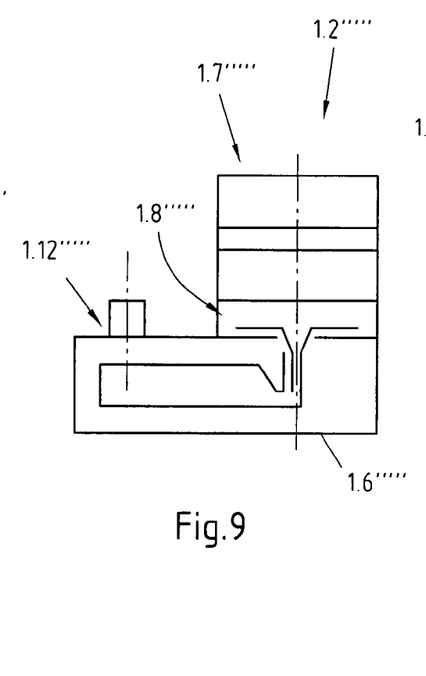
FIG. 9 is a schematic representation of a further preferred embodiment of a support device according to the present invention.

FIG. 9 is a schematic view of a further preferred embodiment of a support unit 1.2'''' for a support device according to the present invention. The support unit 1.2'''', in its principal function and its principal design, widely corresponds to the support unit 1.2'''' shown in FIG. 8. Thus, in the following, it will mainly be referred to the differences with respect to the support unit 1.2''' shown in FIG. 7.

Similar to the embodiment of FIG. 7, the support unit 1.2'''' comprises a movable part 1.7'''' directly and monolithically connected to a base part 1.6'''' via a guiding part 1.8''''. While the base part 1.6'''', the guiding part 1.8'''' and the positioning device 1.12'''' corresponds to the corresponding components of FIG. 8, the difference with respect to the embodiment of FIG. 7 lies within the fact that the movable part 1.7'''' corresponds to the movable part 1.7''' shown in FIG. 7.

Figure 10:
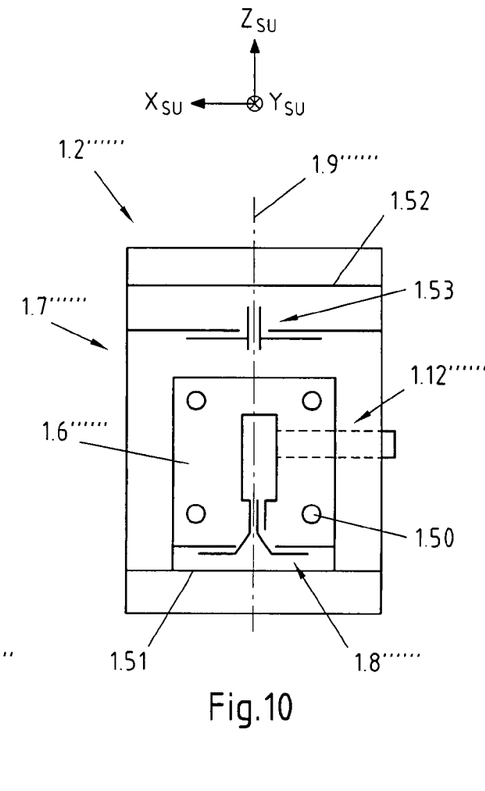
FIG. 10 is a schematic representation of a further preferred embodiment of a support device according to the present invention.

FIG. 10 is a schematic view of a further preferred embodiment of a support unit 1.2''''' for a support device according to the present invention. The support unit 1.2''''', in its principal function, widely corresponds to the support units shown in FIGS. 7 to 9. Thus, in the following, it will mainly be referred to the differences with respect to these support units shown in FIGS. 7 to 9.

The support unit 1.2''''' comprises a movable part 1.7''''' directly and monolithically connected to a base part 1.6''''' via a guiding part 1.8'''''. The base part 1.6''''' may be connected to the first frame unit via connection holes 1.50. The design of the guiding part 1.8''''' corresponds to the design of the guiding part 1.8''' of the embodiment of FIG. 7. For moving the movable part 1.7''''' along its longitudinal axis 1.9''''' there is provided a positioning device 1.12'''''. The design of this positioning device 1.12''''' corresponds to the design of the positioning device 1.12''' of the embodiment of FIG. 7 as well.

To provide for the non-restricted degrees of freedom there is provided, apart from the guiding part 1.8''''', a web-like non-restricted elastic hinge element 1.51, a web-like non-restricted elastic hinge element 1.52 and an elastic hinge 1.53. The web-like elastic hinge element 1.51 is arranged in parallel to the local coordinate axis $X_{SU}$ and corresponds, in its design, to the elastic hinge element 1.35 of the embodiment of FIG. 7. The web-like elastic hinge element 1.52 is arranged in parallel to the local coordinate axis $X_{SU}$ and corrsponds, in its design, to the elastic hinge element 1.35 of the embodiment of FIG. 7 as well. The design of the elastic hinge 1.53 corresponds to the design of the elastic hinge 1.45 of the embodiment of FIG. 8.

The components of the support device described in the foregoing may be manufactured in any suitable way by means of suitable manufacturing processes from any suitable material. In particular they may be manufactured by turning processes, milling processes, grinding processes and erosion processes or combinations thereof.

Usual positioning ranges of the embodiments described are about 100 μm at positioning accuracies that go below 10 nm.

The invention claimed is:

1. Support device for positioning an optical element, comprising:
 a first frame unit and a plurality of support units for supporting said optical element,
 each of said support units having a first end for fixedly engaging a part of said first frame unit and a second end for supporting said optical element;
 said support units being arranged for positioning said optical element along a first direction, a second direction and a third direction in the manner of parallel kinematics,
 said first direction, said second direction and said third direction being translatory directions arranged mutually transverse to each other,
 characterized in that
 there are provided three support units, wherein
 each of said support units provides for restriction of a first degree of freedom and a second degree of freedom to support said optical element in an isostatic manner, and
 one of said support units comprises a movable part bearing an entire fraction of a load to be taken by said one of said support units when supporting said optical element.

2. Support device according to claim 1, characterized in that each of said support units provides for restriction of one translational and one rotational degree of freedom.

3. Support device according to claim 1, characterized in that at least one of said support units comprises a movable part having a first longitudinal extension and comprising said second end;
 said at least one of said support units comprises a guiding part interacting with said movable part during positioning said optical element;
 said guiding part being arranged for guiding said movable part along its first longitudinal extension.

4. Support device according to claim 3, characterized in that said at least one of said support units comprises a positioning device interacting with said movable part for defining the position of said movable part along said first longitudinal extension.

5. Support device according to claim 4, characterized in that said positioning device comprises a passive device, in particular a spacer or a differential screw mechanism.

6. Support device according to claim 4, characterized in that said positioning device comprises an active device, in particular an actuator 7. Support device according to claim 3, characterized in that said guiding part comprises a first elastic hinge element.

8. Support device according to claim 3, characterized in that said guiding part comprises a first leaf spring element.

9. Support device according to claim 3, characterized in that said guiding part comprises a first parallelogram guide mechanism.

10. Support device according to claim 3, characterized in that said first longitudinal extension is inclined with respect to a first plane defined by said first direction and said second direction and inclined with respect to said third direction.

11. Support device according to claim 10, characterized in that said third direction is parallel to the optical axis of said optical element and said first plane is perpendicular to said third direction.

12. Support device according to claim 1, characterized in that at least one of said support units comprises at least a non-restricted hinge element to provide at least one of a set of non-restricted degrees of freedom.

13. Support device according to claim 12, characterized in that said non-restricted hinge element is established by means of a second leaf spring element 14. Support device according to claim 12, characterized in that said non-restricted hinge element is an elastic hinge element.

15. Support device according to claim 12, characterized in that at least two different non-restricted hinge elements are provided to provide at least two different non-restricted degrees of freedom for providing deformation uncoupling.

16. Support device according to claim 3, characterized in that said guiding part is arranged to provide at least one of a set of non-restricted degrees of freedom 17. Support device according to claim 1, characterized in that said optical element is supported by said support units via a second frame unit.

18. Support device according to claim 1,characterized in that at least one of said support units is established in a monolithic manner 19. Support device according to claim characterized in that at least one of said support units is connected to said frame unit in a monolithic manner.

20. Lens barrel, in particular for an optical exposure apparatus, comprising at least one lens module, said lens module comprising an optical element and a support device for positioning an optical element according to claim 1, said support device supporting said optical element.

21. Optical exposure apparatus for transferring an image of a pattern formed on a mask onto a substrate, comprising an optical projection system with a lens barrel according to claim 20.

* * * * *